United States Patent [19]

Savelainen

[11] Patent Number: 4,644,281

[45] Date of Patent: Feb. 17, 1987

[54] COIL ARRANGEMENT FOR PRODUCING A HOMOGENEOUS MAGNETIC FIELD

[75] Inventor: Matti Savelainen, Espoo, Finland

[73] Assignee: Instrumentation Corp., Finland

[21] Appl. No.: 609,635

[22] Filed: May 14, 1984

[30] Foreign Application Priority Data

May 20, 1983 [FI] Finland .................................. 831817

[51] Int. Cl.⁴ .......................................... G01R 33/20
[52] U.S. Cl. .................................... 324/320; 324/319
[58] Field of Search ............... 324/300, 307, 309, 318, 324/319, 320, 322; 335/299; 336/170

[56] References Cited

U.S. PATENT DOCUMENTS

| 4,095,202 | 6/1978 | Danielsson et al. | 335/299 |
| 4,276,529 | 6/1981 | Heinzerling et al. | 335/300 |
| 4,320,342 | 3/1982 | Heinzerling et al. | 324/319 |

*Primary Examiner*—Stephen A. Kreitman
*Assistant Examiner*—Scott M. Oldham
*Attorney, Agent, or Firm*—Andrus, Sceales, Starke & Sawall

[57] ABSTRACT

The invention relates to a coil arrangement for producing a homogeneous magnetic field especially for application to so-called NMR-imaging. An object of the invention is in terms of the size of a coil arrangement to expand the homogeneous area produced by a coil arrangement and, at the same time, to maintain the design of a coil arrangement simple and its manufacturing costs low. According to the invention, a coil arrangement includes three solenoids having a common axis, of which the axial winding width (W1) of the middlemost solenoid (1) is 2.75 ... 2.95, preferably 2.835 ... 2.855 times the mean radius (r1) of the middlemost solenoid (1) and the mean radius (r2) of the outermost solenoids (2) is 1.05 ... 1.07, preferably 1.055 ... 1.061 times the mean radius (r1) of the middlemost solenoid (1) and the axial winding width (W2) thereof is 0.32 ... 0.38, preferably 0.340 ... 0.342 times the mean radius (r1) of the middlemost solenoid (1). In addition, the distance (Z1) from the center point of the outermost solenoids (2) to the center point of the middlemost solenoid (1) is 1.80 . . . 1.95, preferably 1.858 ... 1.868 times the mean radius (r1) of the middlemost solenoid (1) and the electric current density of the middlemost solenoid (1) per unit length in the direction of the axial winding width is 0.250 ... 0.275, preferably 0.2646 ... 0.2666 times the electric current density of the outermost solenoids (2) measured in a corresponding manner.

5 Claims, 1 Drawing Figure

COIL ARRANGEMENT FOR PRODUCING A HOMOGENEOUS MAGNETIC FIELD

The present invention relates to a coil arrangement for producing a homogeneous magnetic field, especially for application to so-called NMR-imagings.

BACKGROUND OF THE INVENTION

A homogeneous magnetic field is a basic requirement for NMR-imagings: the higher homogeneity achieved, the better results obtained. A homogeneous magnetic field can be generated by employing various types of basic geometries, such as the Helmholtz couple, an endwise compensated solenoid whose ends are thicker than midpoint, or separate solenoids. For example, Patent publication EP No.-11335 discloses a solution employing four symmetrically positioned solenoids.

Generally, the manufacturing costs of a coil arrangement are considered proportional to the product of power P spent as resistance faults and winding mass m, said product fulfilling the equation:

$$Pm = kd^4 \cdot B^2,$$

wherein k is a proportionality factor depending on selected geometry and winding material, d is a dimension describing magnet coil, primarily diameter, and B is a generated magnetic field. It will be noted that the costs depend very much on the size of an apparatus. In terms of costs, therefore, it preferable to make a magnet as small as possible. On the other hand, the homogeneity of a generated magnetic field decreases in the radial direction of solenoid at the same rate the distance from the solenoid axis increases. When imaging of an entire human body is to be effected, the homogeneity area, i.e. an area fulfilling certain criteria set for homogeneity of a magnetic field, has become subject to substantial expansion if compared to minor NMR-analysis equipment for analysing individual samples. In practice, this has been achieved by increasing the size of the magnetic coil arrangement included in the apparatus which in turn, on the basis of the above viewpoints, has resulted in substantial increase of manufacturing costs.

The extent of the homogeneity area of a magnetic field can be effected on by magnetic coil dimensioning factors, which depend on the geometry of a coil arrangement and which are in complicated correlation with each other. In the cited Patent publication EP No.-11335, such dimensioning factors have been utilized to improve the homogeneity of a generated magnetic field. This has produced results wherein the homogeneity of a basic magnetic field remains in category $10^{-5}$ when moving by 13.9% from the diameter dimension of a middlemost coil radially away from the coil centre axis and, accordingly, in category $10^{-4}$ when moving by 17.3% from the diameter dimension of a middlemost coil radially away from the coil centre axis.

SUMMARY OF THE INVENTION

An object of the invention is to provide a homogeneous basic magnetic field producing coil arrangement particularly suitable for NMR-imaging purposes and capable, considering the size of said coil arrangement, of providing a homogeneity area more extensive than earlier and still being of simple design and economic in manufacturing costs.

The object of the invention is achieved in a manner that the coil arrangement includes three solenoids having a common axis, of which the axial winding width of the middlemost solenoid is 2.75 . . . 2.95, preferably 2.835 . . . 2.855 times the mean radius of the middlemost solenoid and the mean radius of the outermost solenoids is 1.05 . . . 1.07, preferably 1.055 . . . 1.061 times the mean radius of the middlemost solenoid and the axial winding width thereof is 0.32 . . . 0.38, preferably 0.340 . . . 0.342 times the mean radius of the middlemost solenoid, that additionally the distance from the center point of the outermost solenoids to the center point of the middlemost solenoid is 1.80 . . . 1.95, preferably 1.858 . . . 1.868 times the mean radius of the middlemost solenoid and that the electric current density of the middlemost solenoid per unit length in the direction of the axial winding width is 0.250 . . . 0.275, preferably 0.2646 . . . 0.2666 times the electric current density of the outermost solenoids measured in a corresponding manner.

The most important advantage gained by a coil arrangement of the invention is explicitly the expanded homogeneous area. It can be noted as an example that in the center of a coil arrangement within an area whose width in the direction of the axis of solenoids is 0.645 times the mean radius of the middlemost solenoid and height in the direction orthogonal to the axis of solenoids is 1.774 times the mean radius of the middle-most solenoid, it is possible to reach a magnetic field homogeneity of $2.2 \cdot 10^{-6}$ by properly selecting the values of said dimensions and parameters within said ranges. It should be noted that what is meant by homogeneity in this text is the ratio $\Delta B/B$, wherein B is a produced magnetic field on the axis of solenoid and $\Delta B$ is a mean magnetic field error in said area. A result of the expanded homogeneous area of a coil arrangement is that, if a homogeneous magnetic field is desired in a given area, it can be achieved by means of a coil arrangement of optimum small size. As pointed out above, the size of a coil arrangement has an essential effect on manufacturing costs, so the invention is also advantageous in terms of manufacturing costs.

In terms of the homogeneity of a magnetic field, a preferable effect is obtained by selecting the radial winding height of the outermost solenoids to be 3.5 . . . 3.9 times the radial winding height of the middlemost solenoid. Furthermore, the most preferred radial winding height of the outermost solenoids is 0.13 . . . 0.16 times the mean radius of the middlemost solenoid.

In terms of the installation and assembly of a coil arrangement of the invention it is preferred that the outermost solenoids are displaceably connected to the middlemost solenoid in axial direction, since in practice this is generally a suitable way of compensating the possible insufficient homogeneity of a magnetic field when seeking an optimum combination of values within the above-mentioned ranges of the invention. It should be noted, namely, that an optimum result in a certain homogeneous area can be plausibly reached with a plurality of combinations of values of various dimensions and parameters, since each variable to be selected affects not only the entire unit but also the selection of other variable values when striving for optimum homogeneity of a magnetic field.

DESCRIPTION OF THE DRAWINGS

The invention has been illustrated by the accompanying drawing whose only FIGURE is a principle view of the basic design and dimensioning principles of a coil arrangement of the invention for producing a homogeneous basic magnetic field. It should be pointed out that the dimensions shown in the figure do not necessarily at all correspond to the values of the invention.

DESCRIPTION OF THE PREFERRED EMBODIMENT

Figure 1:
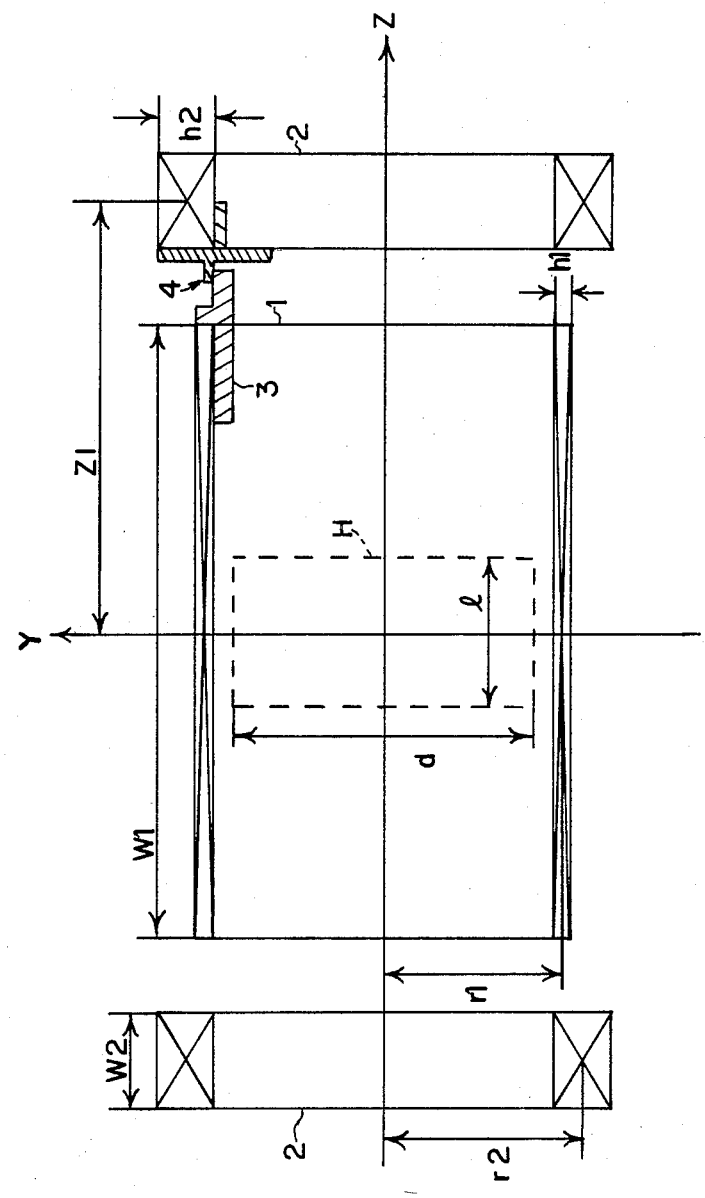

In the drawing, reference numeral 1 designates the middlemost solenoid of a coil arrangement, whose center axis as well as the center axis of the entire coil arrangement and that of the produced homogeneous basic magnetic field coincide with Z-coordinate axis. The mean radius of solenoid 1 is r1, its axial winding width is W1 and radial winding width h1. The mean radius of solenoids 2 placed symmetrically on either side of solenoid 1 is accordingly r2, its axial winding width is W2 and radial winding height h2. The distance between the center points of solenoids 1 and 2 has been designated as Z1. Solenoids 1 and 2 may be the helically wound, multi-layer coils conventionally found in NMR imaging apparatus.

An area H in the center of the coil arrangement whose dimension in the axial direction of the coil arrangement is designated as l and in radial direction as d, represents a particular area used in NMR-imaging, the object being to produce in this area a basic magnetic field as homogeneous as possible by means of solenoids 1 and 2. By selecting $l = 0.645 \times r1$ and $d = 1.774 \times r1$, it is possible, by way of suitably selecting the dimensions and parameters of the invention, to reach in area H a magnetic field homogeneity of $2.2 \cdot 10^{-6}$. This result can probably be achieved by using a plurality of combinations of parameter values. If deviation from optimum selection is made by changing the value of some parameter, the result will be increased inhomogeneity providing that the size of area H is to be kept unchanged. In other words, the original homogeneity criteria now apply only to a smaller area. However, this can be quite well compensated by correspondingly changing the value of some other parameter. A particularly preferred way of effecting such compensation is by changing the value of parameter Z1, i.e. the distance of solenoids 2 from solenoid 1. In practice, this can be effected e.g. as shown in the drawing, the solenoids 2 being displaceably connected to body 3 of solenoid 1 by means of a joint 4.

In practice, the errors or variations of especially the following parameters can be quite well compensated by adjusting the distance Z1 of the solenoids: the ratio of electric current densities I1/I2, W1/W2, W2/r1, h2/r1, h1/h2. It can be pointed out as an example that an error of 1.5% in ratio I1/I2, in other words a shift from optimum value, results in optimum case a change of 0.5% in Z1, the homogeneity deteriorating to value $2.9 \cdot 10^{-6}$. On the other hand, the errors of parameter r1/r2 are most difficult to compensate. For example, an error of 0.15% leads in optimum case to a change of 0.07% in Z1 but, nevertheless, homogeneity will then deteriorate to value $5.4 \cdot 10^{-6}$.

The invention is by no means limited to the described embodiment but a plurality of modifications are conceivable within the scope of the annexed claims.

I claim:

1. A coil arrangement for producing a homogeneous magnetic field especially for application to the so called NMR (nuclear magnetic resonance)-imaging, characterized in, that the coil arrangement includes three solenoids having a common axis, of which the axial winding width (W1) of the middlemost solenoid (1) is 2.75 ... 2.95 times the mean winding radius (r1) of the middlemost solenoid (1), and the mean winding radius (r2) of the outermost solenoids (2) is 1.05 ... 1.07 times the mean winding radius (r1) of the middlemost solenoid (1) and the axial winding width (w2) thereof is 0.32 ... 0.38 times the mean winding radius (r1) of the middlemost solenoid (1), that additionally the distance (Z1) from the center point of the outermost solenoids (2) to the center point of the middlemost solenoid (1) is 1.80 ... 1.95 times the mean winding radius (r1) of the middlemost solenoid (1) and that the electric current density of the middlemost solenoid (1) per unit length in the direction of the axial winding width is 0.250 ... 0.275 times the electric current density of the outermost solenoids (2) in a corresponding manner.

2. A coil arrangement as claimed in claim 1, characterized in, that said outermost solenoids (2) are displaceably connected to the middlemost solenoid (1) in the axial direction.

3. A coil arrangement as claimed in claim 1, characterized in, that the radial winding height (h2) of the outermost solenoids (2) is 3.5 ... 3.9 times the radial winding height (h1) of the middlemost solenoid (1).

4. A coil arrangement as claimed in claim 1, characterized in, that the radial winding height (h2) of the outermost solenoids (2) is 0.13 ... 0.16 times the mean (winding) radius (r1) of the middlemost solenoid (1).

5. A coil arrangement as claimed in claim 1 characterized in that the axial winding width (W1) of the middlemost solenoid (1) is 2.835 ... 2.855 times the mean winding radius (r1) of the middlemost solenoid (1), the mean winding radius (r2) of the outermost solenoids (2) is 1.055 ... 1.061 times the mean winding radius (r1) of the middlemost solenoid, the axial winding width (w2) of the outermost solenoids (2) is 0.340 ... 0.342 times the mean winding radius (r1) of the middlemost solenoid (1), the distance (Z1) from the centerpoint of the outermost solenoids (2) to the centerpoint of the middlemost solenoid (1) is 1.858 ... 1.868 times the mean winding radius (r1) of the middlemost solenoid (1) and that the electric current density of the middlemost solenoid (1) per unit length in the direction of the axial winding width is 0.2645 ... 0.2666 times the electric current density of the outermost solenoids (2) measured in a corresponding manner.

* * * * *